(12) United States Patent
Shafiyan-Rad et al.

(10) Patent No.: US 6,958,694 B1
(45) Date of Patent: *Oct. 25, 2005

(54) MULTI-ANGLE VIEWABLE INDICATOR APPARATUS

(75) Inventors: Saeed Shafiyan-Rad, Nashua, NH (US); Daniel M. Corbosiero, Jr., Hudson, MA (US); Mark Stephen Schladenhauffen, Westford, MA (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 35 days.

This patent is subject to a terminal disclaimer.

(21) Appl. No.: 10/251,395

(22) Filed: Sep. 20, 2002

Related U.S. Application Data

(63) Continuation of application No. 09/590,922, filed on Jun. 9, 2000.

(51) Int. Cl.[7] .............................................. G08B 21/00
(52) U.S. Cl. .............. 340/540; 340/691.1; 340/815.42; 362/551
(58) Field of Search ........................ 340/540, 815.42, 340/815.49, 693.5, 691.1, 473, 686.1, 815.5, 340/815.55, 815.57; 362/541, 551, 555, 544

(56) References Cited

U.S. PATENT DOCUMENTS

| 3,711,669 | A | * | 1/1973 | Keranen ...................... 200/315 |
| 4,082,934 | A | * | 4/1978 | Piber .......................... 200/315 |
| 4,321,443 | A | | 3/1982 | Piber .......................... 200/315 |
| 4,420,740 | A | | 12/1983 | Brown et al. .................. 340/28 |
| 4,504,830 | A | * | 3/1985 | Boehme ................. 340/815.42 |
| 4,667,277 | A | | 5/1987 | Hanchar ...................... 362/250 |
| 4,929,866 | A | * | 5/1990 | Murata et al. .............. 313/500 |
| 4,954,808 | A | * | 9/1990 | Duerkob ..................... 362/541 |
| 4,999,755 | A | | 3/1991 | Lin ............................. 362/250 |
| 5,151,679 | A | | 9/1992 | Dimmick .................... 340/326 |
| 5,327,328 | A | * | 7/1994 | Simms et al. ................ 362/26 |
| 5,633,623 | A | | 5/1997 | Campman ................... 340/321 |
| D391,182 | S | * | 2/1998 | Schneider et al. ......... D10/104 |
| 5,797,767 | A | * | 8/1998 | Schell ......................... 439/490 |
| 5,975,716 | A | | 11/1999 | McSwiggen et al. ....... 362/249 |
| 5,988,842 | A | * | 11/1999 | Johnsen et al. ............. 362/551 |
| 6,044,632 | A | | 4/2000 | Schmalz et al. .......... 56/10.2 R |
| 6,215,409 | B1 | | 4/2001 | Blach ....................... 340/815.4 |

OTHER PUBLICATIONS

Electro-tech system, Inc. "AC Outlet Tester" (Sep. 1997).*

* cited by examiner

*Primary Examiner*—Phung T. Nguyen
(74) *Attorney, Agent, or Firm*—Amin & Turocy LLP; William R. Walbrun

(57) ABSTRACT

An indicator apparatus facilitates visibility of one or more indicators from multiple angles. The apparatus includes a housing having an outer sidewall portion. The sidewall portion, for example, has a first side extending between two adjacent sides. One or more elongated slots are formed in the sidewall portion. One or more light sources are positioned within the one or more elongated slots.

19 Claims, 2 Drawing Sheets

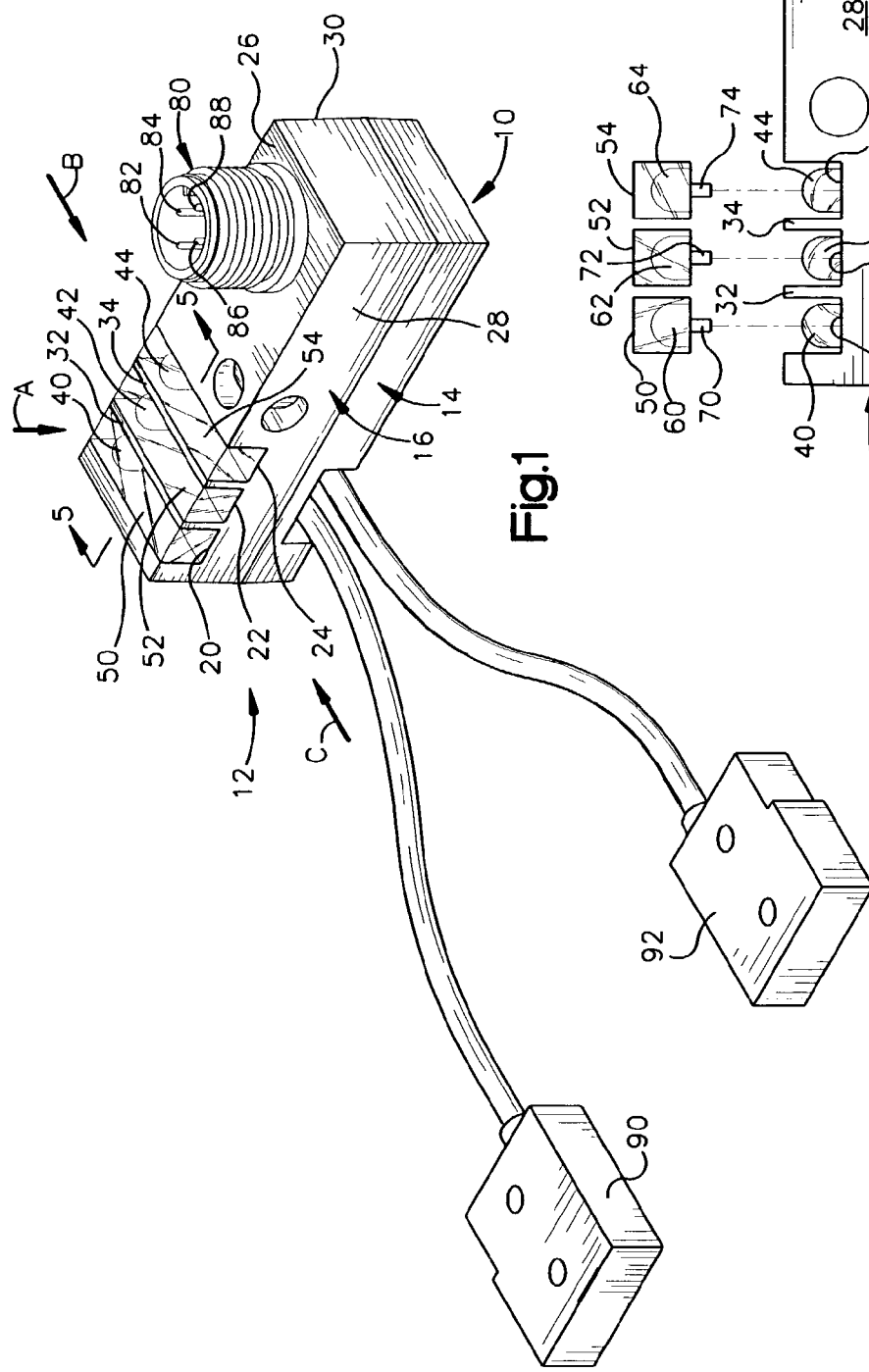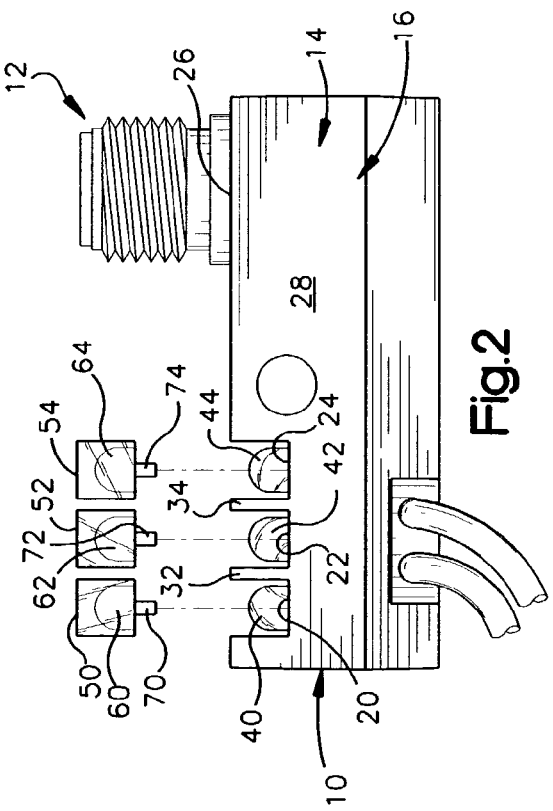

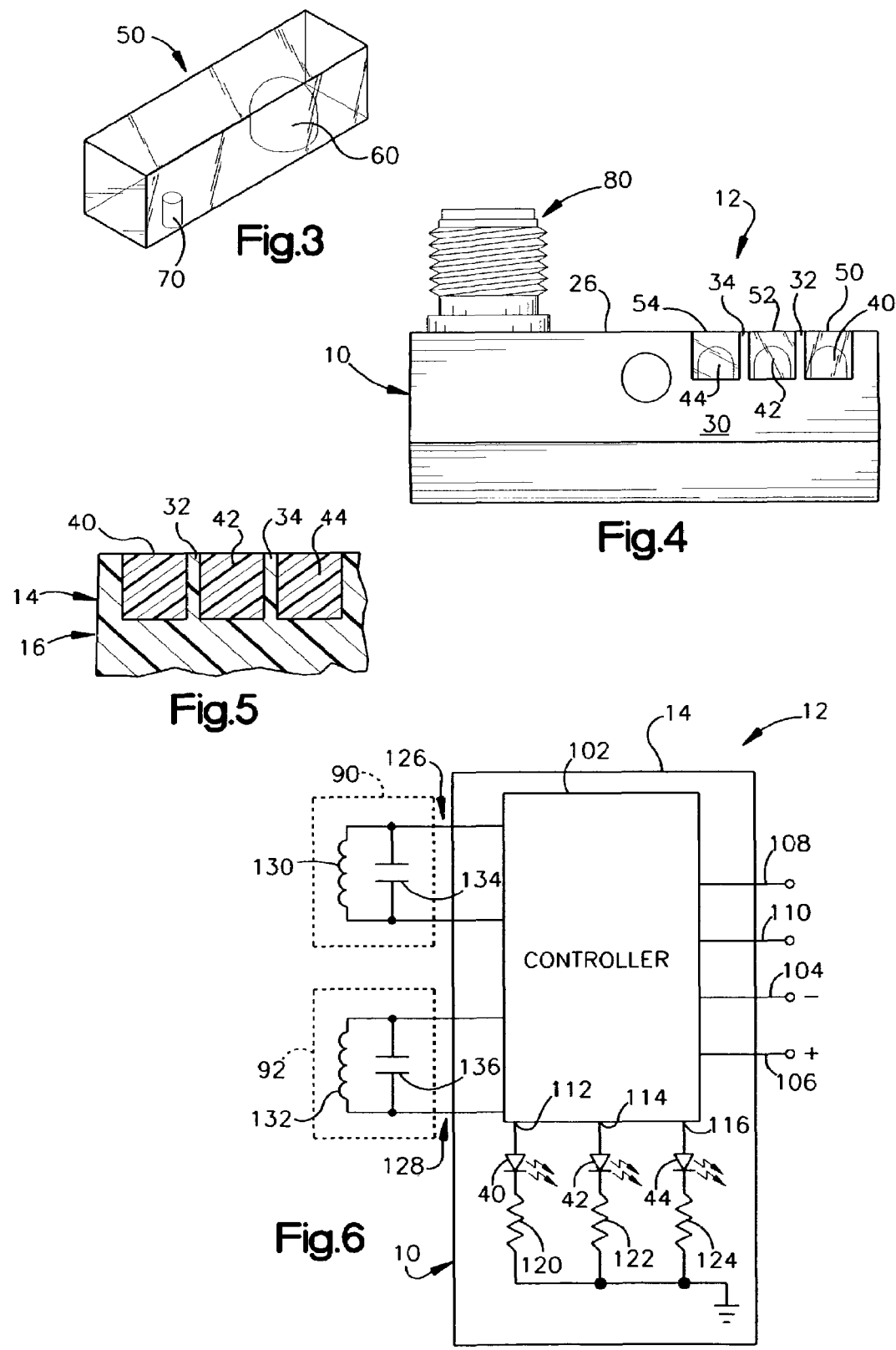

US 6,958,694 B1

MULTI-ANGLE VIEWABLE INDICATOR APPARATUS

REFERENCE TO RELATED APPLICATION

This application is a continuation of U.S. patent application Ser. No. 09/590,922, which was filed Jun. 9, 2000, entitled MULTI-ANGLE VIEWABLE INDICATOR APPARATUS.

TECHNICAL FIELD

The present invention generally relates to an indicator arrangement and, more particularly, to an indicator apparatus having one or more indicators that are viewable from multiple directions.

BACKGROUND

Various types of proximity sensors are used for detecting the presence or absence of an object. Common types of non-contact proximity sensors include inductive proximity sensors, capacitive proximity sensors, ultrasonic proximity sensors, and photoelectric sensors. Such sensors, for example, may be used in motion or position applications, conveyor system control applications, process control applications, robotic welding applications, machine control applications, liquid level detection applications, as well as other known applications.

An inductive proximity sensor, for example, includes an oscillator that provides an oscillating signal to an inductive coil, which provides an electromagnetic field at a predetermined frequency. As an electrically conductive target moves within the field, eddy currents develop within the target in response to the oscillating electromagnetic field. The eddy currents alter the amplitude of the oscillating signal being provided to the coil. The amplitude of the oscillator signal typically is evaluated to provide an output signal indicative of the presence or absence of the object within the electromagnetic field.

One or more indicators may be associated with the proximity sensor for providing an indication of one or more corresponding operating conditions of the sensor. The indicators may be remote relative to the proximity sensor and/or located at the sensor housing. By way of example, one or more light emitting diodes (LEDs) may be mounted at the sensor housing to indicate the operating condition of the sensor system. While a conventional indicator mounting arrangement may be able to provide desired information about the operating condition of the sensor at the housing, the indicators often are not visible from different viewing angles. If the LEDs are arranged to extend outwardly from the housing so as to be sufficiently visible from different viewing angles, however, they are exposed to hazards of the operating environment in which the sensor is employed. Therefore, it is desirable to provide an indicator arrangement that provides improved visibility from multiple angles.

SUMMARY

The present invention relates to an indicator apparatus that facilitates visibility of one or more indicators from multiple viewing angles relative to the apparatus. The indicator apparatus includes a housing having an outer sidewall portion. The sidewall portion, for example, has a first side extending between two adjacent sides. One or more elongated slots are formed in the sidewall portion. A substantially translucent material is disposed in the slot so that the translucent material is visible from more than one side of the housing, such as the first side and another side through which the slot extends. A light source is operatively associated with the substantially translucent material for illuminating the material. As a result, when the light source illuminates the substantially translucent material, the illuminated material is visible from more than one side of the housing. In accordance with a specific aspect of the present invention, the light sources are recessed relative to the outer sidewall of the housing so as to mitigate damage to the light source when used in an industrial environment.

Another aspect of the present invention provides a proximity sensor system. The proximity sensor system includes a proximity sensor for sensing the proximity of a target. The system includes an indicator housing having at least one elongated slot and at least one light source positioned within the at least one elongated slot. The at least one light source is illuminated based on the operating condition of the system.

To the accomplishment of the foregoing and related ends, the invention, then, comprises the features hereinafter fully described and particularly pointed out in the claims. The following description and the annexed drawings set forth in detail certain illustrative aspects of the invention. These aspects are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1 is an isometric view of an indicator apparatus, in accordance with the present invention, illustrated as part of a sensor system;

FIG. 2 is partially exploded side elevation of an indicator apparatus in accordance with the present invention;

FIG. 3 is an isometric view of part of the apparatus of FIG. 2;

FIG. 4 is another side elevation of an indicator apparatus in accordance with the present invention;

FIG. 5 is a partial sectional view of the apparatus taken along line 5—5 of FIG. 1; and FIG. 6 is schematic representation of a proximity sensor system that may utilize an indicator apparatus in accordance with an aspect of the present invention.

DESCRIPTION OF THE INVENTION

Various aspects of the present invention are described below in connection with FIGS. 1–6 in which like reference characters refer to like parts throughout the various views.

FIG. 1 illustrates an indicator apparatus 10, in accordance with an aspect of the present invention. While the particular indicator apparatus 10 is illustrated as being implemented as part of a proximity sensor system 12, those skilled in the art will appreciate that the indicator apparatus is applicable to other types of systems and devices and that all such uses are contemplated as being within the scope of the present invention.

The system 10 includes a housing 14 having an outer sidewall portion 16. For example, the sidewall portion 16 is a rectangular cylinder, although other shapes of housings (e.g., circular cylinder, etc.) also may be implemented in accordance with the present invention.

One or more slots 20, 22, and 24 extend through the sidewall portion 16 of the housing 14. By way of example, a plurality of elongated slots 20, 22, and 24 extend completely through a part of the housing adjacent a top side 26 thereof. That is, the slots 20, 22, and 24 extend from one side 28 through the sidewall 16 to the opposed side 30, intersecting the top side 26. Each of the slots 20, 22, 24 is separated from an adjacent slot by a substantially opaque partition 32, 34. The partitions 32 and 34 extend coextensively between the sides 28 and 30 with each adjacent pair of slots 20, 22 and 22, 24, respectively. In the illustrated example, the slots each have three sidewall surfaces that extend substantially parallel between the sides 28 and 30 of the housing 14. Because the slots 20, 22, and 24 extend completely through the housing 14 (through the sides 26, 28, and 30), the slots are exposed at the top side surface as well as at the opposed side surfaces 28 and 30.

While the slots 20, 22, and 24 are illustrated as extending substantially linearly between the side edges 28 and 30, it is to be understood and appreciated that other shapes of slot configuration may be utilized in accordance with the present invention. For example, the slots 20, 22, and 24 may extend in a curved manner (e.g., correspondingly curved partitions extending between adjacent slots) or extend only partially from one of the sides toward the other opposed side in a curved or linear manner. Furthermore, the distance between adjacent slots (e.g., the thickness of the partitions 32 and 34) may vary from that shown. For example, a greater distance (or thicker partition) or, alternatively, a lesser distance (thinner partition) may be utilized in accordance with the present invention.

As perhaps is best represented in FIG. 2, a light source 40, 42, 44 is associated with each respective slot 20, 22, 24. Each light source 40, 42, 44, which may be an LED, protrudes from the housing 14 into its corresponding slot, but is recessed relative to the outer surface of the sidewall 16. That is, the light sources 40, 42, and 44 do not extend outwardly relative to the outer sidewall 16 of the housing 14.

By way of example, each light source 40, 42, 44 may indicate a different operating condition of the system 12 in which the indicator apparatus 10 is employed. One LED 40 may emit green light, such as to indicate whether the system is connected to an appropriate power source. Another LED 42 may emit an orange light, such as to indicate a first sensing characteristic, and the third LED 44 may emit a red light to indicate a second sensing characteristic. It is to be appreciated that the colors are for purposes of clarity of explanation, as any color light may be associated with the light sources 40, 42, and 44. Additionally, while each light source 40, 42, 44 has been described as extending outwardly from a lower surface of each respective slot 20, 22, 24, alternatively, the light sources may be recessed below the lower surface of the slot so long as they are capable of providing light into their corresponding slots.

In accordance with an aspect of the present invention, a length (or strip) of a substantially translucent material 50, 52, 54 is disposed within each respective slot 20, 22, 24. Each length of the translucent material 50, 52, 54 is dimensioned and configured according to the dimensions and configurations of each corresponding slot. Alternatively, the translucent material may extend outwardly from or be recessed relative to the outer sidewall portion 16.

With reference to FIGS. 2 and 3, for example, the length of the translucent material 50 is in the form of an elongated, rectangular cylindrical strip. A receptacle 60, 62, 64 is formed into each strip 50, 52, 54 from its bottom side for receiving a portion of the light source 40, 42, 44 protruding from the lower sidewall surface of the corresponding slot 20, 22, 24. A retaining tab 70, 72, 74 also extends from the bottom side of each respective strip 50, 52, 54 spaced apart from the receptacle. The retaining tabs are configured to interlock with a corresponding receptacle (or bore) formed in the lower sidewall surface of the respective slot and spaced laterally from the light source.

The elongated strips 50, 52, and 54, for example, are formed of a generally rigid material, such as a polymer, a resin or other material, which may provide a suitable substantially translucent medium for transmitting light emitted from each associated light source. Each portion of translucent material also may be colored or stained to impart particular information or simply to help distinguish between the different strips of material. This may be in addition to or as an alternative to utilizing differently colored light sources. In addition to providing a medium for transmission of light through the housing from a respective light source, each strip also covers and protects a corresponding LED from environmental hazards.

Each strip 50, 52, 54 is located in a corresponding slot 20, 22, 24, as shown in FIGS. 1 and 4, with each light source 40, 42, 44 being received in a respective receptacle 60, 62, 64. The exposed edges of each strip at sides 26, 28, and 30, for example, substantially conform to the contour of the outer sidewall portion 16 at each adjacent side 26, 28, and 30 of the housing. That is, in the illustrated examples, each strip 50, 52, 54 has an outer surface that is substantially flush with an adjacent outer surface of the housing 14. In this way, the indicator apparatus may have a substantially smooth sidewall portion 16. As mentioned above, the strips alternatively may be recessed or extend outwardly relative to outer sidewall 16 of the housing.

FIG. 5 is a cross-sectional view of the housing 14 of the indicator apparatus 10. The strips 50, 52, and 54 are disposed in each slot, with each strip separated from another strip by an intermediate partition. The partitions 32 and 34 are illustrated as an integral part of the housing 14, although other substantially opaque means may be provided to separate the translucent strips 50, 52, and 54. For example, individual spacers or a coating of a substantially opaque material may be interposed between each pair of adjacent strips to inhibit transmission of light from one strip to another strip. For purposes of illustration, the housing 14 and the strips 50, 52, and 54 are illustrated as being formed of a plastic-like material. It is to be appreciated, however, that any suitable material may be employed to form the housing, partitions and the strips, such as metal, thermosetting resin, plastic, etc. Different materials may be selected, for example, according to the environment in which the indicator apparatus 10 is to be employed and/or the type of sensing system 12.

Referring back to FIG. 1, in order to implement a proximity sensing function, the housing 14 also includes a connector 80. The connector 80 includes a plurality of pins 82, 84, 86, and 88 for receiving power and/or providing output signals indicative of one or more operating conditions of the proximity sensing system 12. The proximity sensing system 12 also includes a pair of sensing probes (commonly referred to as chicklets) 90 and 92, which are illustrated as being remote relative to the housing 14. Each of the probes 90, 92, for example, contains a sensing coil (not shown) that is energized to provide an oscillating electric field. Alternatively, one or more sensors may be located within the housing for performing a desired sensing function. Electronics are contained within the housing 14 to monitor the oscillating signal at the probes 90 and 94 in order to determine the proximity (e.g., presence or absence) of a target relative to the respective probes. One or more of the light sources 40, 42, and 44 may be activated according to the condition at each sensor probe 90, 92 (based on the oscillating signal thereof) and/or other operating conditions of the sensing system 12.

As a light source 40, 42, 44 is activated to emit light, the associated strip 50, 52, 54 is illuminated and the illuminated strip is visible from a plurality of viewing angles, indicated by arrows A, B, and C. In particular, the illumination of each strip 50, 52, 54 is visible from the top side 26 of the housing (arrow A) and from the side surfaces 28 and 30 (arrows B and C) that the strip intersects. By knowing which color indicates which operating condition, for example, a technician or other individual may monitor the operating condition of the assembly from a plurality of viewing angles without a need to closely inspect a particular side of the housing 14. Additionally, the strips 50, 52, and 54 of translucent material are visible from two diametrically opposed sides 28 and 30 so as to be visible from diametrically opposed sides (e.g., viewing angles B and C) relative to the housing 14.

FIG. 6 illustrates a schematic representation of an example of a proximity sensing system 12 corresponding to the system of FIG. 1, in which like reference numbers refer to parts previously identified with respect to FIG. 1. The system 12 includes an indicator apparatus 10 having a housing 14 that contains circuitry for performing a proximity sensing function. By way of example, the circuitry includes a controller 102, which may be programmed and/or configured to determine one or more operating conditions of the system 12 and provide output signals indicative of the determined conditions. A pair of power inputs 104 and 106 is connectable to a power source (not shown), such as a DC source, for providing electrical energy to the system 12 and, in particular, to the controller 102.

The controller 102 has a plurality of outputs 108, 110, 112, 114, and 116 for providing signals indicative of operating condition of the system 12. By way of example, The outputs 112, 114, and 116 are connected to corresponding LEDs 40, 42, and 44. Each of the LEDs 40, 42, and 44 are connected in series with a respective current limiting resistor 120, 122, 124 between the controller 102 and a reference electrical potential (e.g., ground). The controller 102 provides an output signal at each output 112, 114,116 for activating or deactivating each respective LED 40, 42, 44 according to an associated operating condition of the system 12.

One or more sensors (or sensor probes) 90 and 92 are connected to the controller 102 via connections 126 and 128, respectively, each of which is illustrated as a connector pair. As mentioned above, one or more sensors, alternatively, may be located within the housing 14. The sensors 90 and 92, may be any type of sensor, such as, for example, inductive proximity sensors, capacitive proximity sensors, ultrasonic proximity sensors, photoelectric sensors, etc. In this example, the sensors 90 and 92 are inductive proximity sensors, each represented as including an inductor 130, 132 and a capacitor 134, 136. The controller 102 provides an oscillating signal to each sensor 90, 92 for causing each sensor to oscillate and provide an oscillating electric field at a predetermined frequency. One or more characteristics (e.g., amplitude, frequency, etc.) of each oscillating signal varies as a function of the proximity of a target relative to the each respective sensor 90, 92. The controller 102 monitors the oscillating signals and provides output signals based on the monitored operating characteristics. For example, the sensor output signals may be discrete output pulses as a target enters and leaves the sensing field.

By way of example, one LED 40 may emit green light to indicate whether the system is connected to an appropriate power source. The LED 42 may emit an orange light to indicate a first sensing condition, while the LED 44 emits a red light to indicate a second sensing characteristic. In accordance with the present invention, each LED 40, 42, 44 is associated with an elongated strip of a translucent material 50, 52, 54 (FIG. 1) that is illuminated according to activation of each LED by the controller 102. Because the strips 50, 52, and 54 are visible from multiple viewing angles relative to the housing 14 (whether illuminated or not), the operating condition is easily monitored from a plurality of viewing angles. The controller 102 also provides signals to other outputs 108 and 110, which may be provided to external circuitry that, for example, may control operation of other associated equipment and/or processes (not shown).

It is to be understood and appreciated that the present invention contemplates that, the apparatus 10 may contain any type of sensor, including, for example, an inductive proximity sensor, a capacitive proximity sensor, an ultrasonic proximity sensor, a photoelectric sensor, etc. In view of the foregoing description, an indicator housing arrangement in accordance with the present invention provides improved visibility of one or more indicators from a plurality of viewing angles. Additionally, the indicator lights (LEDs), which are recessed relative to the outer sidewall portion, also are protected from the environment, as each light is covered with an, appropriate translucent material.

What has been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising."

What is claimed is:

1. An indicator apparatus, comprising:
    a housing that has at least two elongated slots disposed across the surface thereof and extending through at least two other orthogonal sides thereof; and
    at least one light source positioned within each of the at least two elongated slots;
    wherein a first light source employs a first color to indicate a status of a first operating condition, and at least a second light source employs a different color to indicate a status of at least a second operating condition of a system in which the indicator apparatus is employed.

2. The indicator apparatus of claim 1, wherein the at least one elongated slot extends from one side of the housing through a sidewall to an opposed side of the housing while intersecting a top side of the housing, which permits the at least one light source to be viewed from at least three orthogonal surfaces.

3. The indicator apparatus of claim 1, further comprising a plurality of elongated slots wherein each of the elongated slots is separated from an adjacent slot by a substantially opaque partition.

4. The indicator apparatus of claim 3, wherein the substantially opaque partition extends coextensively between two opposing sides of the housing.

5. The indicator apparatus of claim 1, wherein the at least one elongated slot is exposed at a top side of the housing and at two opposing sides of the housing.

6. The indicator apparatus of claim 1, wherein the at least one light source is a light emitting diode (LED).

7. The indicator apparatus of claim 1, wherein the at least one light source extends outwardly from a lower surface of the at least one elongated slot.

8. The indicator apparatus of claim 1, wherein the at least one light source is recessed below a lower surface of the at least one elongated slot.

9. The indicator apparatus of claim 1, wherein a strip of substantially translucent material is disposed at least partially within the at least one elongated slot, and wherein the at least one light source illuminates the edges and/or surface(s) of the translucent material.

10. An indicator system that facilitates determination of an operating state of a device, comprising:
 a housing that has a plurality of elongated slots disposed across, and extending through at least two sides of, the surface thereof;
 a plurality of light sources respectively positioned to be viewable via the plurality of elongated slots wherein light is transmitted in at least three orthogonal planes; and
 a plurality of substantially translucent strips disposed at least partially within the plurality of elongated slots, wherein the at least one light source illuminates the edges and/or surface(s) of the substantially translucent strips;
 wherein the plurality of substantially translucent strips respectively include retaining tab(s) for interlocking with a corresponding bore located in a lower sidewall surface of a corresponding elongated slot.

11. The indicator system of claim 10, wherein the plurality of light sources have an illuminated condition and non-illuminated condition, each condition being indicative of an operating state of the device.

12. The indicator system of claim 10, wherein the at least tree orthogonal planes include a top side of the housing and two opposing sides of the housing.

13. The indicator system of claim 10, wherein the plurality of light sources are recessed relative to the outer surface of the housing.

14. The indicator system of claim 10, wherein each of the plurality of light sources is associated with a different color for indicating a different operating state.

15. A proximity sensor system, comprising:
 a proximity sensor that has a pair of sensor probes for sensing the proximity of an object;
 an indicator housing that has at least one elongated slot orthogonal to the surface thereof, the at least one elongated slot extends through a first orthogonal side and at least one other orthogonal side of the indicator housing;
 at least one light source disposed within the at least one elongated slot, wherein the at least one light source is activated according to a condition at each sensor probe; and
 at least one substantially translucent strip disposed at least partially within the at least one elongated slots, wherein the at least one light source illuminates the edges and/or surface(s) of the at least one substantially translucent strip;
 wherein each of the at least one substantially translucent strip includes a retaining tab for interlocking with a corresponding bore located in a lower sidewall surface of a corresponding elongated slot.

16. The proximity sensor system of claim 15, wherein the at least one light source is transmitted in at least three orthogonal planes.

17. The proximity sensor system of claim 15, further comprising a controller for determining one or more operating conditions of the system and for providing output signals indicative of the determined conditions.

18. A sensing system, comprising:
 means for sensing the presence of an object; and
 means for indicating at least two operating conditions associated with the means for sensing, said means for indicating comprising at least one light source disposed within each of at least two elongated slots of a means for housing at least a portion of the means for sensing, the elongated slots disposed within and extending through a first orthogonal side and at least a second orthogonal side of the surface of the means for housing to permit light from the at least one light source to be emitted along a plurality of planes, each light source is associated with a color unique to an operating condition indicated the light source.

19. An indicator apparatus, comprising:
 a housing that has at least two elongated slots so that extend through at least two orthogonal sides of the surface thereof; and
 at least one light source positioned coincident with each of the at least two elongated slots so as to be viewable in at least three orthogonal planes from the three orthogonal sides through which the slot extends, each light source is associated with a unique color that identifies an operating condition indicated by the light source.

* * * * *